United States Patent
Yamamoto et al.

(10) Patent No.: US 9,479,113 B2
(45) Date of Patent: Oct. 25, 2016

(54) CLOCK SIGNAL GENERATING CIRCUIT

(71) Applicant: Rohm Co., Ltd., Kyoto (JP)

(72) Inventors: Takateru Yamamoto, Kyoto (JP); Kazuma Shiomi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/877,046

(22) Filed: Oct. 7, 2015

(65) Prior Publication Data

US 2016/0103466 A1    Apr. 14, 2016

(30) Foreign Application Priority Data

Oct. 8, 2014    (JP) .................................. 2014-207188

(51) Int. Cl.
 - G06F 1/08    (2006.01)
 - H03C 3/00    (2006.01)
 - H03B 23/00   (2006.01)
 - H03B 5/24    (2006.01)

(52) U.S. Cl.
 CPC ................. *H03B 23/00* (2013.01); *G06F 1/08* (2013.01); *H03B 5/24* (2013.01); *H03C 3/00* (2013.01)

(58) Field of Classification Search
 CPC .......... H03B 23/00; H03B 5/24; H03B 5/20; H03K 3/0315; G06F 1/04; H03M 1/44; H03C 3/00

USPC ............................................. 331/78, 178, 57
See application file for complete search history.

(56) References Cited

U.S. PATENT DOCUMENTS

| | | | |
|---|---|---|---|
| 8,773,213 B2* | 7/2014 | Nishitani | H01L 28/40 331/108 B |
| 8,981,858 B1* | 3/2015 | Wright | H03K 3/84 331/111 |
| 2008/0100350 A1* | 5/2008 | Pernia | H03L 5/00 327/114 |

FOREIGN PATENT DOCUMENTS

JP    2014-143235    8/2014

* cited by examiner

*Primary Examiner* — Ryan Johnson
(74) *Attorney, Agent, or Firm* — Fish & Richardson P.C.

(57) ABSTRACT

A clock signal generating circuit includes: an oscillator having a trimming function of arbitrarily adjusting an oscillation frequency of a first clock signal generated by the oscillator depending on trimming data; and a trimming data modulation part configured to dynamically change a reference trimming data for adjusting the oscillation frequency of the first clock signal to generate modulation trimming data, and output the modulation trimming data, as the trimming data, to the oscillator.

10 Claims, 22 Drawing Sheets

FIG. 4A

| Frequency before trimming | Trimming data |
|---|---|
| 4.80 MHz | 8'b 10001010 |
| 4.91 MHz | 8'b 10001001 |
| 4.92 MHz | 8'b 10001000 |
| 4.93 MHz | 8'b 10000111 |
| 4.94 MHz | 8'b 10000110 |
| 4.95 MHz | 8'b 10000101 |
| 4.96 MHz | 8'b 10000100 |
| 4.97 MHz | 8'b 10000011 |
| 4.98 MHz | 8'b 10000010 |
| 4.99 MHz | 8'b 10000001 |
| 5.00 MHz | 8'b 10000000 |
| 5.01 MHz | 8'b 01111111 |
| 5.02 MHz | 8'b 01111110 |
| 5.03 MHz | 8'b 01111101 |
| 5.04 MHz | 8'b 01111100 |
| 5.05 MHz | 8'b 01111011 |
| 5.06 MHz | 8'b 01111010 |
| 5.07 MHz | 8'b 01111001 |
| 5.08 MHz | 8'b 01111000 |
| 5.09 MHz | 8'b 01110111 |
| 5.10 MHz | 8'b 01110110 |

Resistance value Small ↑
Resistance value Large ↓

FIG. 4B

| Frequency before trimming | Trimming data |
|---|---|
| 4.80 MHz | 8'b 10001010 |
| 4.91 MHz | 8'b 10001001 |
| 4.92 MHz | 8'b 10001000 |
| 4.93 MHz | 8'b 10000111 |
| 4.94 MHz | 8'b 10000110 |
| 4.95 MHz | 8'b 10000101 |
| 4.96 MHz | 8'b 10000100 |
| 4.97 MHz | 8'b 10000011 |
| 4.98 MHz | 8'b 10000010 |
| 4.99 MHz | 8'b 10000001 |
| 5.00 MHz | 8'b 10000000 |
| 5.01 MHz | 8'b 01111111 |
| 5.02 MHz | 8'b 01111110 |
| 5.03 MHz | 8'b 01111101 |
| 5.04 MHz | 8'b 01111100 |
| 5.05 MHz | 8'b 01111011 |
| 5.06 MHz | 8'b 01111010 |
| 5.07 MHz | 8'b 01111001 |
| 5.08 MHz | 8'b 01111000 |
| 5.09 MHz | 8'b 01110111 |
| 5.10 MHz | 8'b 01110110 |

Resistance value Small ↑
↓ Resistance value Large

FIG. 7A

| Frequency before trimming | Trimming data | |
|---|---|---|
| 4.80 MHz | 8'b 10001010 | |
| 4.91 MHz | 8'b 10001001 | |
| 4.92 MHz | 8'b 10001000 | |
| 4.93 MHz | 8'b 10000111 | +5 |
| 4.94 MHz | 8'b 10000110 | +4 |
| 4.95 MHz | 8'b 10000101 | +3 |
| 4.96 MHz | 8'b 10000100 | +2 |
| 4.97 MHz | 8'b 10000011 | +1 |
| 4.98 MHz | 8'b 10000010 | Adjustment reference |
| 4.99 MHz | 8'b 10000001 | −1 |
| 5.00 MHz | 8'b 10000000 | −2 |
| 5.01 MHz | 8'b 01111111 | −3 |
| 5.02 MHz | 8'b 01111110 | −4 |
| 5.03 MHz | 8'b 01111101 | −5 |
| 5.04 MHz | 8'b 01111100 | |
| 5.05 MHz | 8'b 01111011 | |
| 5.06 MHz | 8'b 01111010 | |
| 5.07 MHz | 8'b 01111001 | |
| 5.08 MHz | 8'b 01111000 | |
| 5.09 MHz | 8'b 01110111 | |
| 5.10 MHz | 8'b 01110110 | |

FIG. 7B

| Frequency before trimming | Trimming data | |
|---|---|---|
| 4.80 MHz | 8'b 10001010 | |
| 4.91 MHz | 8'b 10001001 | |
| 4.92 MHz | 8'b 10001000 | |
| 4.93 MHz | 8'b 10000111 | |
| 4.94 MHz | 8'b 10000110 | |
| 4.95 MHz | 8'b 10000101 | |
| 4.96 MHz | 8'b 10000100 | |
| 4.97 MHz | 8'b 10000011 | |
| 4.98 MHz | 8'b 10000010 | |
| 4.99 MHz | 8'b 10000001 | +5 |
| 5.00 MHz | 8'b 10000000 | +4 |
| 5.01 MHz | 8'b 01111111 | +3 |
| 5.02 MHz | 8'b 01111110 | +2 |
| 5.03 MHz | 8'b 01111101 | +1 |
| 5.04 MHz | 8'b 01111100 | Adjustment reference |
| 5.05 MHz | 8'b 01111011 | −1 |
| 5.06 MHz | 8'b 01111010 | −2 |
| 5.07 MHz | 8'b 01111001 | −3 |
| 5.08 MHz | 8'b 01111000 | −4 |
| 5.09 MHz | 8'b 01110111 | −5 |
| 5.10 MHz | 8'b 01110110 | |

FIG. 9A

| Frequency before trimming | Trimming data | Adjustment reference |
|---|---|---|
| 4.80 MHz | 8'b 10001010 | |
| 4.91 MHz | 8'b 10001001 | |
| 4.92 MHz | 8'b 10001000 | |
| 4.93 MHz | 8'b 10000111 | |
| 4.94 MHz | 8'b 10000110 | |
| 4.95 MHz | 8'b 10000101 | |
| 4.96 MHz | 8'b 10000100 | |
| 4.97 MHz | 8'b 10000011 | |
| 4.98 MHz | 8'b 10000010 | |
| 4.99 MHz | 8'b 10000001 | −1 |
| 5.00 MHz | 8'b 10000000 | −2 |
| 5.01 MHz | 8'b 01111111 | −3 |
| 5.02 MHz | 8'b 01111110 | −4 |
| 5.03 MHz | 8'b 01111101 | −5 |
| 5.04 MHz | 8'b 01111100 | −6 |
| 5.05 MHz | 8'b 01111011 | −7 |
| 5.06 MHz | 8'b 01111010 | −8 |
| 5.07 MHz | 8'b 01111001 | |
| 5.08 MHz | 8'b 01111000 | |
| 5.09 MHz | 8'b 01110111 | |
| 5.10 MHz | 8'b 01110110 | |

FIG. 9B

| Frequency before trimming | Trimming data | |
|---|---|---|
| 4.80 MHz | 8'b 10001010 | +8 |
| 4.91 MHz | 8'b 10001001 | +7 |
| 4.92 MHz | 8'b 10001000 | +6 |
| 4.93 MHz | 8'b 10000111 | +5 |
| 4.94 MHz | 8'b 10000110 | +4 |
| 4.95 MHz | 8'b 10000101 | +3 |
| 4.96 MHz | 8'b 10000100 | +2 |
| 4.97 MHz | 8'b 10000011 | +1 |
| 4.98 MHz | 8'b 10000010 | Adjustment reference |
| 4.99 MHz | 8'b 10000001 | |
| 5.00 MHz | 8'b 10000000 | |
| 5.01 MHz | 8'b 01111111 | |
| 5.02 MHz | 8'b 01111110 | |
| 5.03 MHz | 8'b 01111101 | |
| 5.04 MHz | 8'b 01111100 | |
| 5.05 MHz | 8'b 01111011 | |
| 5.06 MHz | 8'b 01111010 | |
| 5.07 MHz | 8'b 01111001 | |
| 5.08 MHz | 8'b 01111000 | |
| 5.09 MHz | 8'b 01110111 | |
| 5.10 MHz | 8'b 01110110 | |

CLOCK SIGNAL GENERATING CIRCUIT

CROSS-REFERENCE TO RELATED APPLICATION

This application is based upon and claims the benefit of priority from Japanese Patent Application No. 2014-207188, filed on Oct. 8, 2014, the entire contents of which are incorporated herein by reference.

TECHNICAL FIELD

The present disclosure relates to a clock signal generating circuit.

BACKGROUND

As electronic devices become multi-functional, achieve high speed, and are highly integrated, electro-magnetic interference (EMI) due to electromagnetic radiation emitted from large scale integration (LSI) mounted thereon is problematic. Rigid international standards for EMI exist for, in particular, LSI for vehicle devices and LSI for industrial devices, as well as an LSI mounted on consumer equipment, and LSI that fails to meet the requirements cannot be mounted on vehicle devices or industrial devices.

As one of countermeasures for EMI, a spread spectrum clock generator (SSCG) circuit is known. An EMI peak may be suppressed by modulating an oscillation frequency of a clock signal using the SSCG circuit, compared with a case of fixing the oscillation frequency of the clock signal.

FIG. 20 is a block diagram illustrating a related-art clock signal generating circuit (general SSCG circuit). A clock signal generating circuit 500 illustrated in FIG. 20 is a circuit for receiving a reference clock to output a modulation clock, and includes a reference divider 501 (dividing ratio: 1/R), a programmable divider 502 (dividing ratio: 1/N), a frequency phase comparator 503, a charge pump 504, a filter 505, a V-I converter 506, and a voltage controlled oscillator 507.

However, many circuit blocks are needed when configuring the clock signal generating circuit 500. On this account, it is difficult to implement an SSCG circuit in an LSI that does not allow for an increase in a circuit area.

SUMMARY

The present disclosure provides some embodiments of a clock signal generating circuit capable of easily realizing frequency spreading of a clock signal.

According to an embodiment of the present disclosure, a clock signal generating circuit includes: an oscillator having a trimming function of arbitrarily adjusting an oscillation frequency of a first clock signal generated by the clock signal generating circuit, depending on trimming data; and a trimming data modulation part configured to dynamically change a reference trimming data for adjusting the oscillation frequency of the first clock signal, generate modulation trimming data, and output the modulation trimming data, as the trimming data, to the oscillator (first feature).

Further, the clock signal generating circuit according to the first feature may further include a counter configured to count the number of pulses of the first clock signal to output a counter value, wherein the trimming data modulation part is configured to switch a data value of the modulation trimming data at a frequency change timing based on the counter value (second feature).

Further, the clock signal generating circuit according to the first feature may further include a second oscillator configured to generate a second clock signal having a fixed oscillation frequency; and a counter configured to count the number of pulses of the second clock signal to output a counter value, wherein the trimming data modulation part is configured to switch a data value of the modulation trimming data at a frequency change timing based on the counter value (third feature).

Further, in the clock signal generating circuit according to the third feature, the second oscillator may be configured to have a trimming function for arbitrarily adjusting an oscillation frequency of the second clock signal generated by the second oscillator itself depending on the reference trimming data (fourth feature).

Further, the clock signal generating circuit according to the third or fourth feature may further include a selector configured to select and output one of the first clock signal and the second clock signal (fifth feature).

Further, in the clock signal generating circuit according to the fifth feature, a plurality of the selector may be installed (sixth feature).

Further, the clock signal generating circuit having any one of the first to sixth features may further include a trimming data holding part configured to hold the reference trimming data by using a non-volatile memory, a Zener zap method, a polysilicon fuse method, or a laser cutting method (seventh feature).

Further, in the clock signal generating circuit according to any one of the first to seventh features, the trimming data modulation part may be configured to perform center spreading for changing the modulation trimming data based on the reference trimming data as a central value, down-spreading for changing the modulation trimming data based on the reference trimming data as an upper limit value, or up-spreading for changing the modulation trimming data based on the reference trimming data as a lower limit value (eighth feature).

Further, in the clock signal generating circuit according to any one of the first to eighth features, the trimming data modulation part may be configured to have a function of setting ON/OFF of frequency spreading with respect to the oscillation frequency of the first clock signal, a function of setting a modulation period of the oscillation frequency in the frequency spreading, and a function of setting a modulation width of the oscillation frequency in the frequency spreading (ninth feature).

Further, the electronic device disclosed herein includes the clock signal generating circuit according to any one of the first to ninth features (tenth feature).

BRIEF DESCRIPTION OF THE DRAWINGS

FIGS. 4A and 4B are views illustrating a configuration example of trimming data.

FIGS. 7A and 7B are views illustrating a first modulation example (center spreading) of modulation trimming data.

FIGS. 9A and 9B are views illustrating a second modulation example (down-spreading) and a third modulation example (up-spreading) of modulation trimming data.

DETAILED DESCRIPTION

<Basic Configuration>

Figure 1:
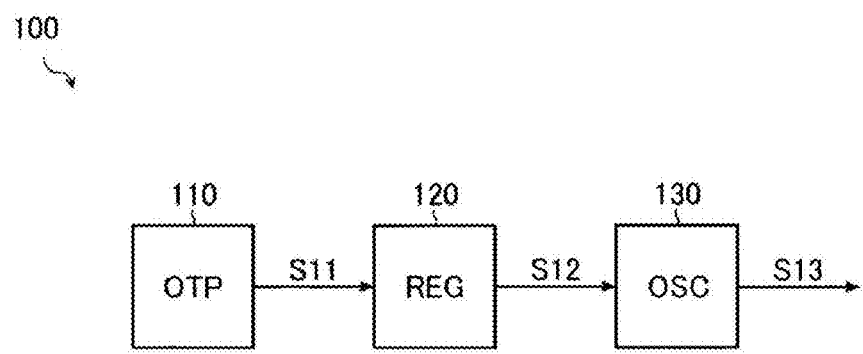
FIG. 1 is a block diagram illustrating a basic configuration example of a clock signal generating circuit.

FIG. 1 is a block diagram illustrating a basic configuration example of a clock signal generating circuit. The clock signal generating circuit 100 of this configuration example is a base circuit (a clock signal generating circuit having a trimming function) that can implement a frequency spreading function (to be described later), and includes a trimming data holding part 110, a register 120, and an oscillator 130.

The trimming data holding part 110 holds trimming data S11 in a non-volatile manner using a non-volatile memory (one-time programmable read only memory (OTPROM) in the drawing) or a known method such as a Zener zap method, a polysilicon fuse method, or a laser cutting method. Further, the trimming data S11 is a data signal for arbitrarily adjusting an oscillation frequency f1 of a clock signal S13 generated by the oscillator 130.

The register 120 stores the trimming data S11 read from the trimming data holding part 110, as register data S12, in a predetermined address.

The oscillator 130 outputs the clock signal S13 to each part of an electronic device in which the clock signal generating circuit 100 is installed. Further, the oscillator 130 has a trimming function for arbitrarily adjusting the oscillation frequency f1 of the clock signal S13 generated by the oscillator 130 itself depending on the register data S12 (=trimming data S11) read from the register 120.

Figure 2:
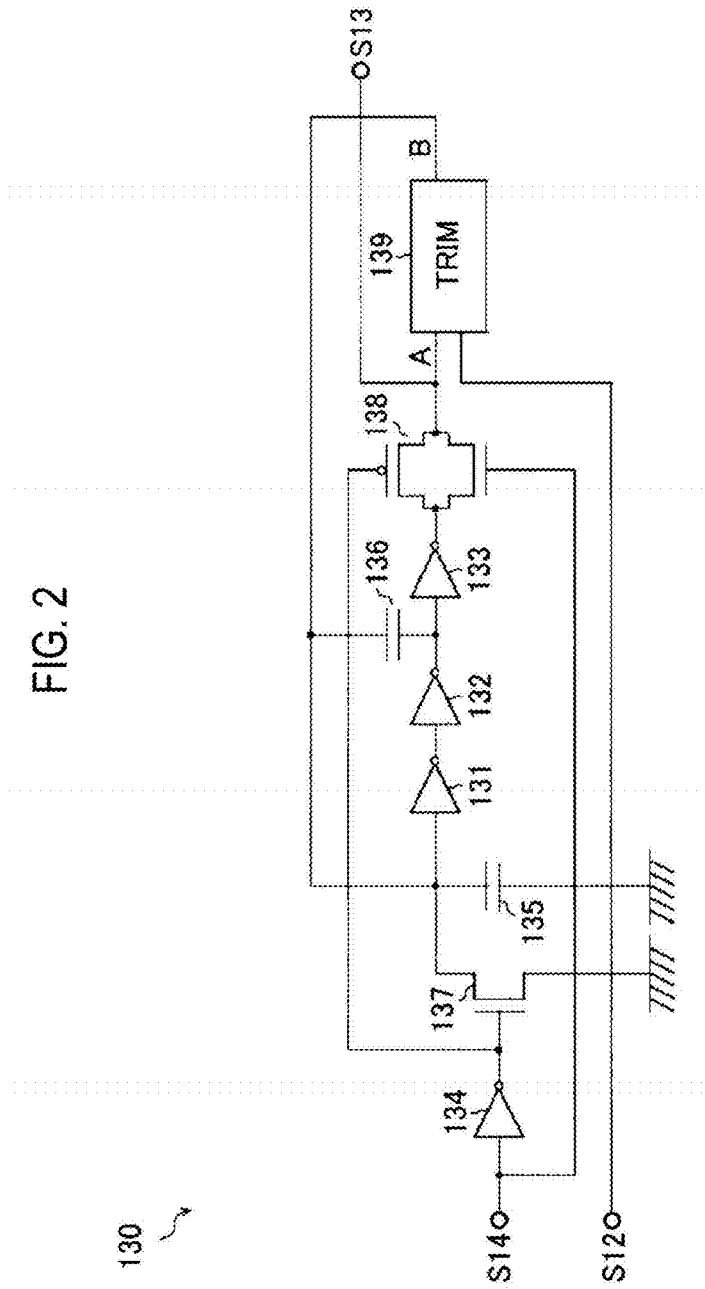
FIG. 2 is a circuit diagram illustrating a configuration example of an oscillator 130.

FIG. 2 is a circuit diagram illustrating a configuration example of the oscillator 130. The oscillator 130 of this configuration example includes inverters 131 to 134, capacitors 135 and 136, an N-channel type metal oxide semiconductor (MOS) field effect transistor 137, a transmission gate 138, and a trimming function part 139.

An input terminal of the inverter 131 is connected to a drain of the transistor 137. An output terminal of the inverter 131 is connected to an input terminal of the inverter 132. An output terminal of the inverter 132 is connected to an input terminal of the inverter 133. An output terminal of the inverter 133 is connected to a first terminal of the transmission gate 138. A second terminal of the transmission gate 138 is connected to an output terminal of the clock signal S13 and an input terminal (node A) of the trimming function part 139. An output terminal (node B) of the trimming function part 139 is connected to the input terminal of the inverter 131. In this manner, in the oscillator 130 of this configuration example, a ring oscillator including the inverters 131 to 133 in three stages is formed. However, the number of stages of delay elements is not limited thereto.

Both of an input terminal of the inverter 134 and a non-inverting control terminal of the transmission gate 138 are connected to an input terminal of an enable signal S14. An output terminal of the inverter 134 is connected to a gate of the transistor 137 and an inverting control terminal of the transmission gate 138. A source of the transistor 137 is connected to a ground terminal. The capacitor 135 is connected between the input terminal of the inverter 131 and the ground terminal. The capacitor 136 is connected between the input terminal of the inverter 131 and the output terminal of the inverter 132. In this circuit configuration, an operation of generating the clock signal S13 is allowed (enabled) when the enable signal S14 has a high level, and an operation of generating the clock signal S13 is prohibited (disabled) when the enable signal S14 has a low level.

In order to increase the precision of the oscillation frequency f1, the trimming function part 139 switches a time constant τ (=R×C) of an RC filter, depending on the register data S12 (=trimming data S11).

Figure 3:
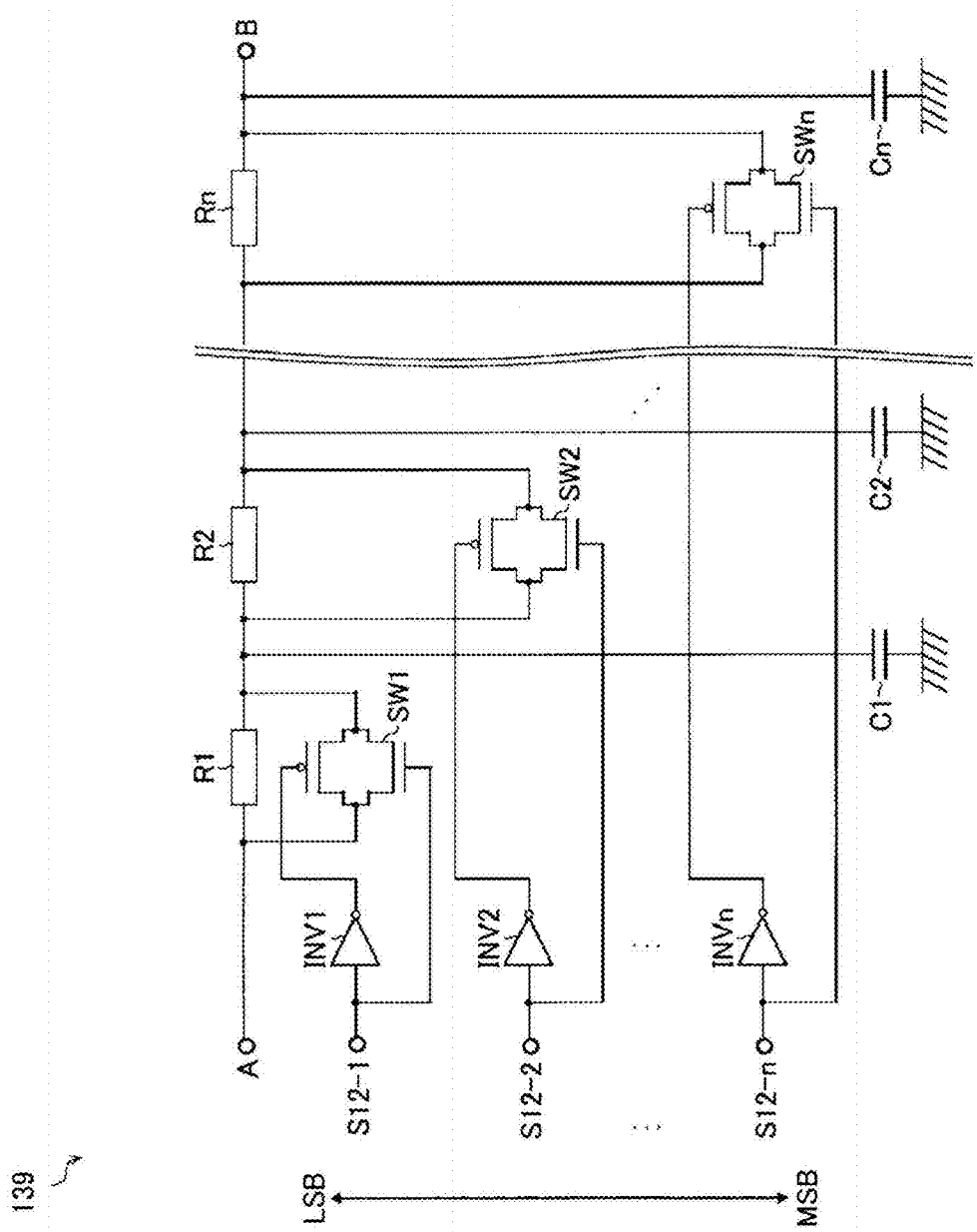
FIG. 3 is a circuit diagram illustrating a configuration example of a trimming function part 139.

FIG. 3 is a circuit diagram illustrating a configuration example of the trimming function part 139. The trimming function part 139 of this configuration example includes resistors R1 to Rn (resistance values: R1<R2< . . . <Rn), capacitors C1 to Cn, inverters INV1 to INVn, and transmission gates SW1 to SWn. N-bit register data S12 (least significant bit S12-1 to most significant bit S12-n) are input to the trimming function part 139 of this configuration example.

The resistors R1 to Rn are connected in series between a node A and a node B in order as illustrated. The capacitors C1 to Cn are connected between each terminal of the resistors R1 to Rn and a ground terminal, respectively, to form an RC filter together with the resistors R1 to Rn. The transmission gates SW1 to SWn are connected in parallel to the resistors R1 to Rn, respectively. Input terminals of the inverters INV1 to INVn and non-inverting control terminals of the transmission gates SW1 to SWn are connected to input terminals of resistor data S12-1 to S12-n, respectively. Output terminals of the inverters INV1 to INVn are connected to inverting control terminals of the transmission gates SW1 to SWn, respectively.

For example, when the resistor data 12-1 is at a low level, the transmission gate SW1 is turned off, so that the RC filter including the resistor R1 and the capacitor C1 is inserted between the node A and the node B. Meanwhile, when the resistor data S12-1 is at a high level, the transmission gate SW1 is turned on to short both ends of the resistor R1, so that the RC filter including the resistor R1 and the capacitor C1 is not inserted between the node A and the node B. This is the same for the resistor data S12-2 to S12-n. Thus, the time constant τ of the RC filter inserted between the node A and the node B may be arbitrarily switched depending on logical levels of the register data S12-1 to S12-n. Further, as the time constant τ increases, the oscillation frequency f1 decreases, and as the time constant τ decreases, the oscillation frequency f1 increases.

FIGS. 4A and 4B are views illustrating a configuration example of the trimming data S11. In the trimming tables illustrated in FIGS. 4A and 4B, there is one-to-one correspondence between the oscillation frequency f1 before trimming and the trimming data S11 (8 bits (n=8)).

In order to adjust or tune the oscillation frequency f1 to a desired target value, a series of operations including: first measuring the oscillation frequency f1 before trimming; determining a data value of the trimming data S11 with reference to the illustrated trimming table, based on the measurement result; and holding the trimming data S11 having the corresponding data value in a trimming data holding part 110 are performed.

Further, the illustrated trimming tables are prepared in order to adjust the oscillation frequency f1 to 5.00 MHz. For example, when the oscillation frequency f1 before trimming is originally identical to 5.00 MHz, the data value of the trimming data S11 is set to "10000000". At this time, in the trimming function part 139, only both ends of the resistor R8 having the highest resistance value are shorted. This state corresponds to a state where the time constant $\tau$ of the RC filter is set to an intermediate value of a range that is configurable.

Meanwhile, when the oscillation frequency f1 before trimming is 4.98 MHz, the data value of the trimming data S11 is set to "10000010" as illustrated in the column (a). At this time, in the trimming function part 139, both ends of the resistor R2, as well as both ends of the resistor R8 having the highest resistance value, are shorted. As a result, the time constant $\tau$ of the RC filter is reduced, compared with the case in which the oscillation frequency f1 before trimming is originally 5.00 MHz, and thus, the oscillation frequency f1 is increased from 4.98 MHz to 5.00 MHz.

Further, when the oscillation frequency f1 before trimming is 5.04 MHz, the data value of the trimming data S11 is set to "01111100" as illustrated in the column (b). At this time, in the trimming function part 139, the resistor R8 having the highest resistance value is inserted into the RC filter, so that both ends of each of the resistors R3 to R7 having resistance values lower than the highest resistance value (R3+R4+R5+R6+R7<R8) are shorted. As a result, the time constant $\tau$ of the RC filter is increased, compared with the case in which the oscillation frequency f1 before trimming is originally 5.00 MHz, and thus, the oscillation frequency f1 is decreased from 5.04 MHz to 5.00 MHz.

Since the oscillation frequency f1 can be adjusted to the desired target value through the foregoing trimming, the precision of the oscillation frequency f1 can be enhanced.

Figure 5A:
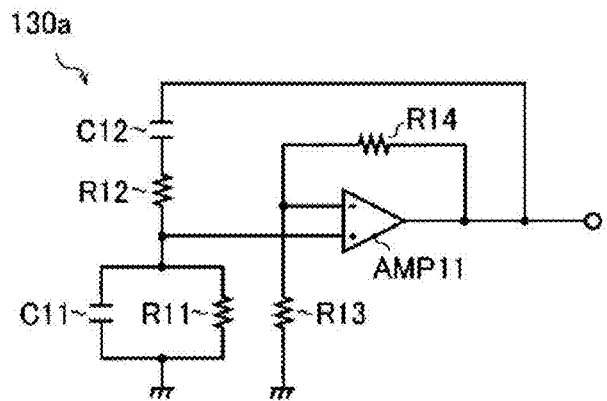
FIGS. 5A to 5C are tables illustrating a modification of the oscillator 130.
Figure 5B:
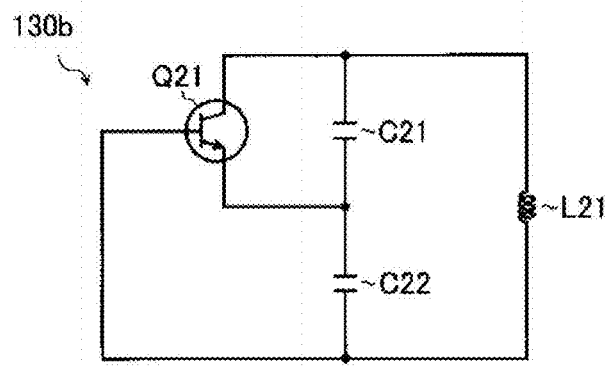
Figure 5C:
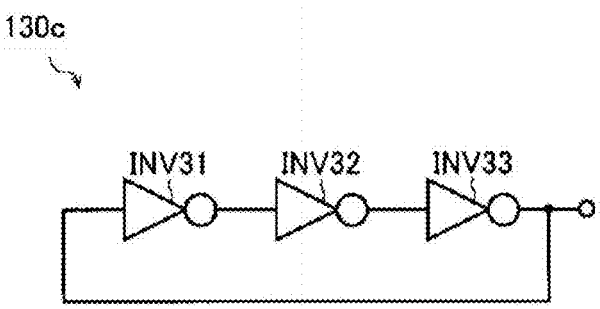

FIGS. 5A to 5C are tables illustrating a modification of the oscillator 130 to which the trimming may be applied.

An oscillator 130a of the column (a), which is a so-called wein bridge RC oscillation circuit, includes resistors R11 to R14, capacitors C11 and C12, and an operational amplifier AMP11. A first terminal of the resistor R11, a first terminal of the resistor R12, and a first terminal of the capacitor C11 are all connected to a non-inverting input terminal (+) of the operational amplifier AMP11. A second terminal of the resistor R11 and a second terminal of the capacitor C11 are both connected to a ground terminal A second terminal of the resistor R12 is connected to a first terminal of the capacitor C12. A second terminal of the capacitor C12 is connected to an output terminal of the operational amplifier AMP11. A first terminal of the resistor R13 and a first terminal of the resistor R14 are both connected to an inverting input terminal (−) of the operational amplifier AMP11. A second terminal of the resistor R13 is connected to the ground terminal A second terminal of the resistor R14 is connected to an output terminal of the operation amplifier AMP11. In the oscillator 130a of this configuration example, the oscillation frequency f1 may be variably controlled by adjusting each characteristic value by a combination of the resistor R11 and the resistor R12 or a combination of the capacitor C11 and the capacitor C12.

An oscillator 130b of the column (b), which is a so-called Colpitts LC oscillation circuit, includes an npn-type bipolar transistor Q21, a coil L21, and capacitors C21 and C22. A collector of the transistor Q21 is connected to each of a first terminal of the capacitor C21 and a first terminal of the coil L21. An emitter of the transistor Q21 is connected to each of a second terminal of the capacitor C21 and a first terminal of the capacitor C22. A base of the transistor Q21 is connected to each of a second terminal of the capacitor C22 and a second terminal of the coil L21. In the oscillator 130b of this configuration example, the oscillation frequency f1 may be variably controlled by adjusting each capacitance value of the capacitors C21 and C22.

An oscillator 130c of the column (c), which is a ring oscillator obtained by further simplifying the configuration of FIG. 2, includes inverters INV31 to INV33. In the oscillator 130c of this configuration example, the trimming function part 139 that switches the time constant $\tau$ of the RC filter is omitted. Thus, the oscillation frequency f1 is determined depending on a delay amount of the inverters INV31 to INV33 that form an inverter chain. The delay amount of the inverters INV31 to INV33 is changed depending on current capability of a power source for supplying power to the inverters INV31 to INV33. Thus, the oscillation frequency f1 may be variably controlled by adjusting the current capability.

Further, the circuit configurations of the oscillator 130 illustrated with reference to FIGS. 2 and 5A to 5B are merely illustrative and any circuit configuration may be employed as long as trimming is applicable.

First Embodiment

Figure 6:
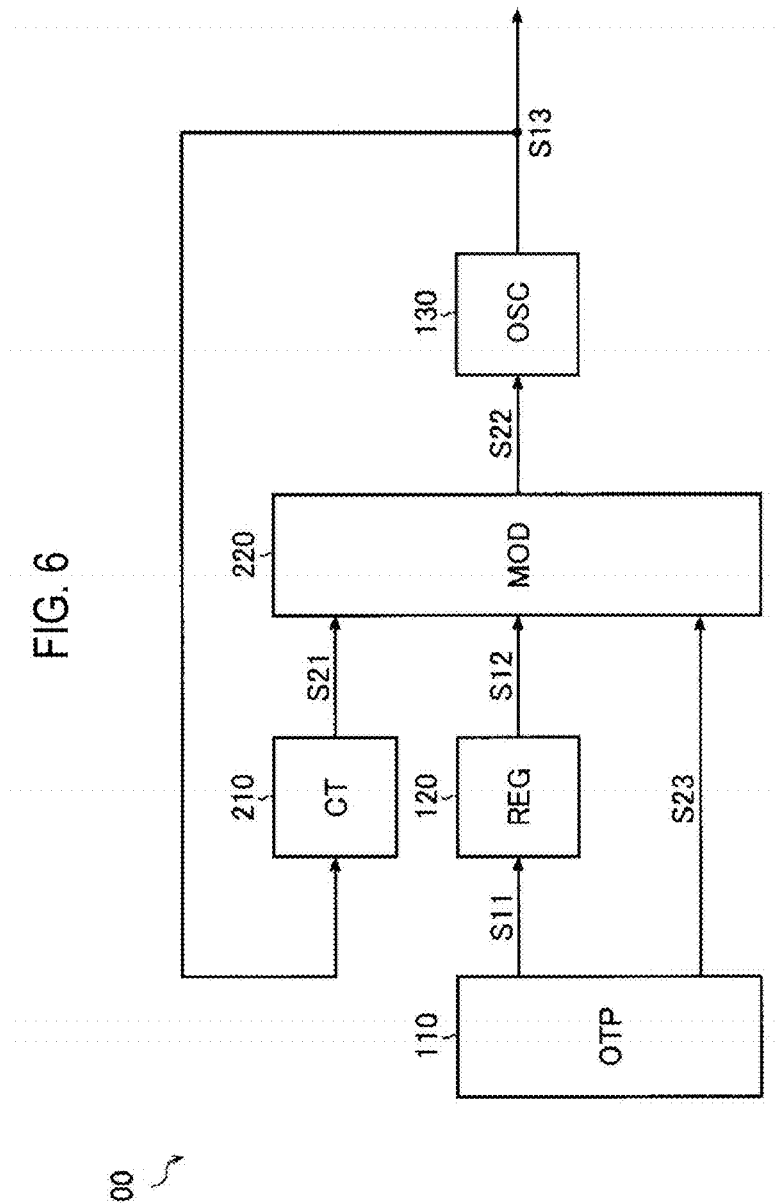
FIG. 6 is a block diagram illustrating a first embodiment of a clock signal generating circuit.

FIG. 6 is a block diagram illustrating a first embodiment of a clock signal generating circuit. A clock signal generating circuit 200 of the first embodiment is based on the foregoing basic configuration (FIG. 1) and additionally includes a counter 210 and a trimming data modulation part 220 as circuit blocks for implementing a frequency spreading function using a trimming function. Thus, the same circuit blocks as those of the foregoing basic configuration will be given the same reference numerals as those of FIG. 1 and a repeated description thereof will be omitted, and a characteristics part of the first embodiment will be largely described hereinafter.

The counter 210 counts the number of pulses of a clock signal S13 to output a counter value S21.

The trimming data modulation part 220 generates modulation trimming data S22 by dynamically changing register data S12 (hereinafter, referred to as "reference trimming data S12" for convenience of description) at a frequency change timing based on the counter value S21, and outputs the modulation trimming data S22, instead of the reference trimming data S12, to the oscillator 130. Specifically, whenever the counter value S21 reaches a predetermined upper limit value, the trimming data modulation part 220 repeats a series of operations including: generating a pulse of a frequency change timing signal (an internal signal of the trimming data modulation part 220); switching a data value of the modulation trimming data S22 using the pulse as a trigger; and resetting the counter value S21 to a zero value.

Further, the trimming data modulation part 220 may be implemented as a simple logic circuit.

As described above, in the clock signal generating circuit 200 of the first embodiment, the reference trimming data S12 having a fixed data value is not input to the oscillator 130 as it is, but the modulation trimming data S22 obtained by dynamically changing the data value of the reference trimming data S12 is input to the oscillator 130.

Figure 20:
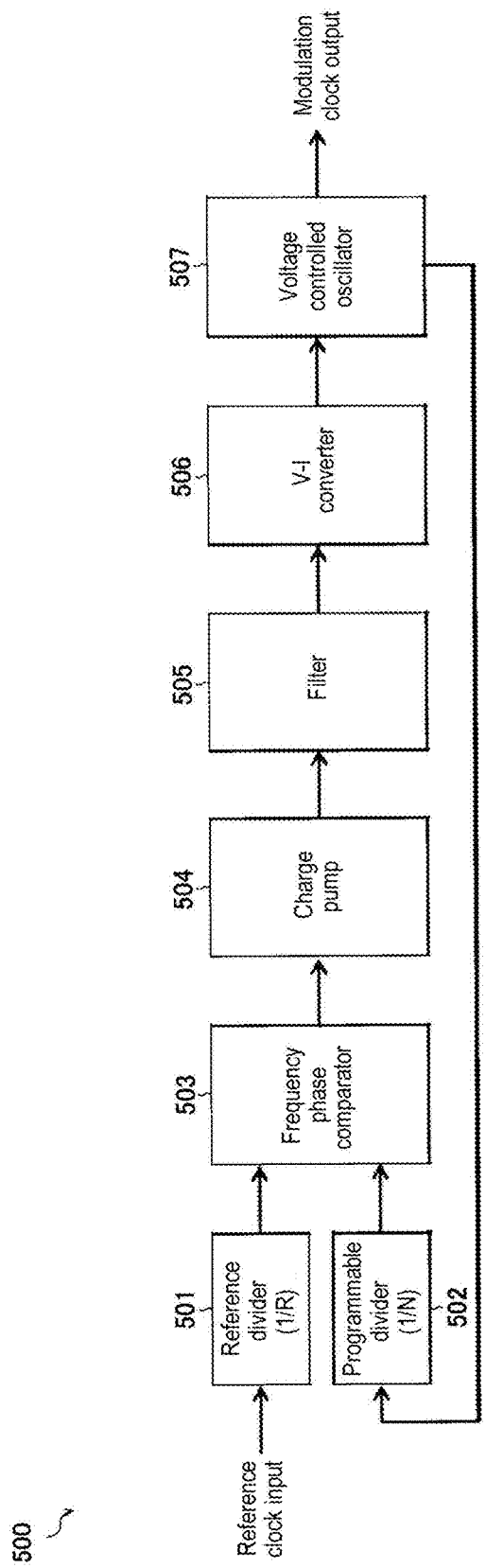
FIG. 20 is a block diagram illustrating a related-art clock signal generating circuit.

With this configuration, modulation (frequency spreading) of the oscillation frequency f1 may be realized by simply adding the counter 210 and the trimming data modulation part 220 to the small clock signal generating circuit 100 (see FIG. 1), without using the existing large SSCG circuit (see FIG. 20).

Further, the trimming data modulation part 220 may additionally have a function of setting ON/OFF of frequency spreading with respect to the oscillation frequency f1 (whether to through-output the reference trimming data S12 to the oscillator 130), a function of setting a modulation period (an upper limit value of the counter value S21) of the oscillation frequency f1 in the frequency spreading, or a function of setting a modulation width (an upper limit value and a lower limit value of an adjustment step in the modulation trimming data S22) of the oscillation frequency f1 in the frequency spreading, depending on a setting signal S23. The setting signal S23 may be read from an OTPROM or the register 120 or may be input from the outside of the device.

FIGS. 7A and 7B are views illustrating a first modulation example (center spreading) of the modulation trimming data S22. In the examples of FIGS. 7A and 7B, a case in which the modulation trimming data S22 is changed up and down by five steps respectively using the reference trimming data S12 as a central value is considered.

As illustrated in the column (a), when the oscillation frequency f1 before trimming is 4.98 MHz, the data value of the reference trimming data S12 is set to "10000010". Thus, when the reference trimming data S12 is through-output to the oscillator 130, the oscillation frequency f1 after trimming is adjusted to 5.00 MHz.

At this time, the trimming data modulation part 220 dynamically changes the data value of the modulation trimming data S22 up and down by five steps based on the data value (which corresponds to an adjustment reference value) of the reference trimming data S12 as a central value. More specifically, the trimming data modulation part 220 dynamically changes the data value of the modulation trimming data S22 from an upper limit value "10000111" (=adjustment reference value+five steps) to a lower limit value "01111101" (=adjustment reference value−five steps). As a result, the oscillation frequency f1 is periodically swung based on 5.00 MHz as a central value.

Further, as illustrated in the column (b), when the oscillation frequency f1 before trimming is 5.04 MHz, the data value of the reference trimming data S12 is set to "01111100". Thus, when the reference trimming data S12 is through-output to the oscillator 130, the oscillation frequency f1 after trimming is adjusted to 5.00 MHz.

At this time, the trimming data modulation part 220 dynamically changes the data value of the modulation trimming data S22 up and down by five steps respectively based on the data value (which corresponds to an adjustment reference value) of the reference trimming data S12 as a central value. More specifically, the trimming data modulation part 220 dynamically changes the data value of the modulation trimming data S22 from an upper limit value "10000001" (=adjustment reference value+five steps) to a lower limit value "01110111" (=adjustment reference value−five steps). As a result, the oscillation frequency f1 is periodically swung based on 5.00 MHz as a central value.

Further, when the oscillation frequency f1 before trimming significantly deviates from a target value, the data value of the reference trimming data S12 becomes close to a maximum value (11111111) or a minimum value (00000000) and the modulation trimming data S22 cannot be swung in a full range (±five steps in the foregoing example). In order to avoid this problem, it is preferred to establish a setting prohibition range corresponding to at least a modulation step portion (five steps in the foregoing example) from the maximum value and the minimum value respectively, rather than allowing for setting of the reference trimming data S12 in a full range from the maximum value to the minimum value.

Figure 8:
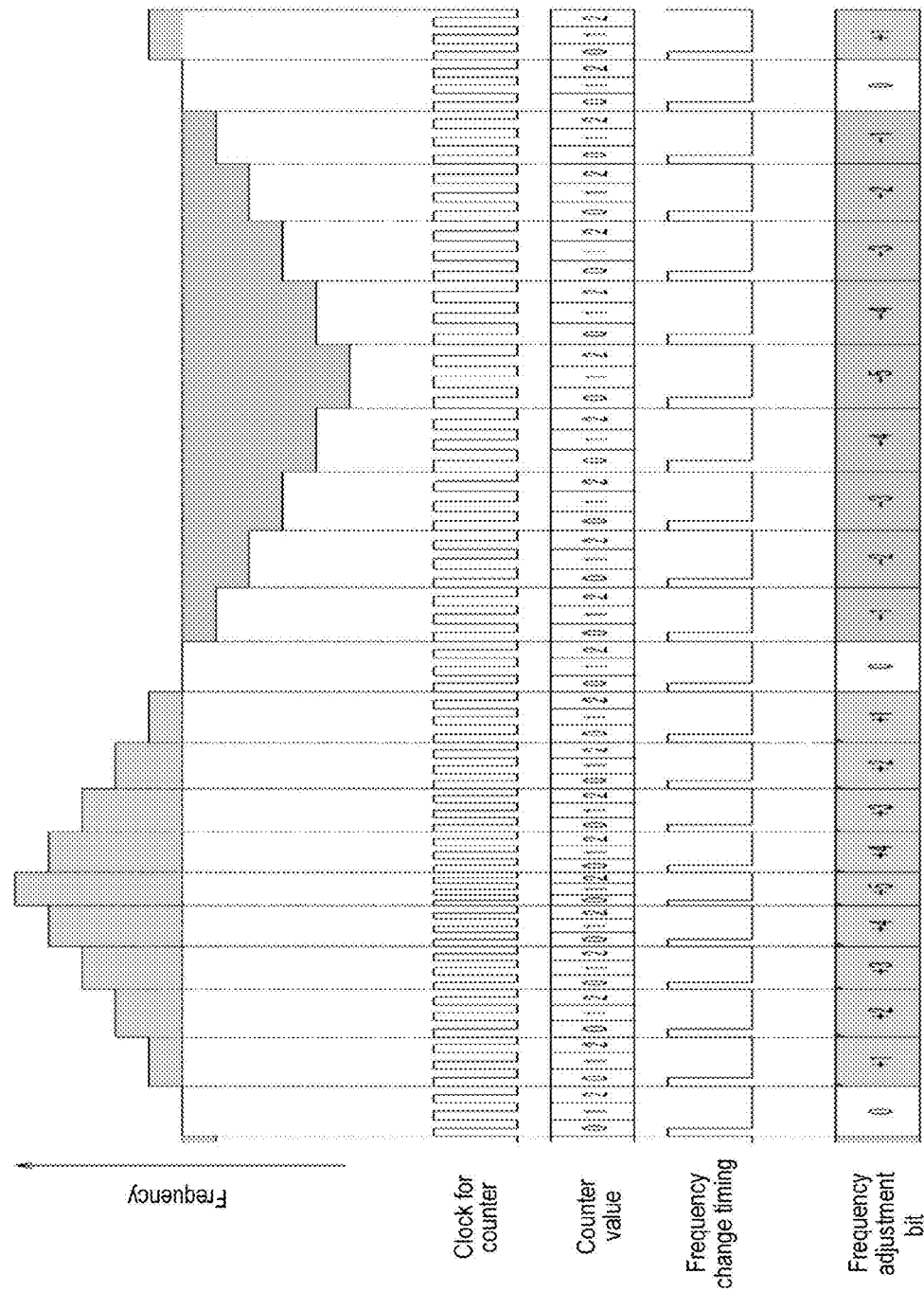
FIG. 8 is a timing chart illustrating results of a center spreading in the first embodiment.

FIG. 8 is a timing chart illustrating results of a center spreading in the first embodiment, in which the oscillation frequency f1, a clock (=clock signal S13) for counter, the counter value S21, a frequency change timing signal, and a frequency adjustment bit are illustrated sequentially from above.

In the example of FIG. 8, a trigger pulse of the frequency change timing signal is generated whenever a pulse of the clock signal S13 is counted three times, and the frequency adjustment bit is cyclicly switched by one step each time from +five steps to −five steps in synchronization with the trigger pulse. As a result, the oscillation frequency f1 of the clock signal S13 is periodically changed based on the target value as a central value.

FIGS. 9A and 9B are views illustrating a second modulation example (down-spreading) and a third modulation example (up-spreading) of the modulation trimming data S22. In the examples of FIGS. 9A and 9B, a case in which the modulation trimming data S22 is changed by eight steps only in a lower side using the reference trimming data S12 as an upper limit value and the modulation trimming data S22 is changed by eight steps only in an upper side using the reference trimming data S12 as a lower limit value is considered.

As illustrated in the columns (a) and (b), when the oscillation frequency f1 before trimming is 4.98 MHz, the data value of the reference trimming data S12 is set to "10000010". Thus, when the reference trimming data S12 is through-output to the oscillator 130, the oscillation frequency f1 after trimming is adjusted to 5.00 MHz.

When the oscillation frequency f1 is down-spread, in the trimming data modulation part 220, as illustrated in the column (a), the data value of the modulation trimming data S22 is dynamically changed by eight steps only in the lower side based on the data value (which corresponds to the adjustment reference value) of the reference trimming data S12 as an upper limit value. More specifically, the trimming data modulation part 220 dynamically changes the data value of the modulation trimming data S22 from the upper limit value "10000010" (=adjustment reference value) to the lower limit value "01111010" (=adjustment reference value−eight steps). As a result, the oscillation frequency f1 is periodically swung based on 5.00 MHz as the upper limit value.

Meanwhile, when the oscillation frequency f1 is up-spread, in the trimming data modulation part 220, as illustrated in the column (b), the data value of the modulation trimming data S22 is dynamically changed by eight steps only in the upper side based on the data value (which corresponds to the adjustment reference value) of the reference trimming data S12 as a lower limit value. More specifically, the trimming data modulation part 220 dynamically changes the data value of the modulation trimming data S22 from the upper limit value "10001010" (=adjustment reference value+eight steps) to the lower limit value "10000010" (=adjustment reference value). As a result, the oscillation frequency f1 is periodically swung based on 5.00 MHz as the lower limit value.

Figure 10:
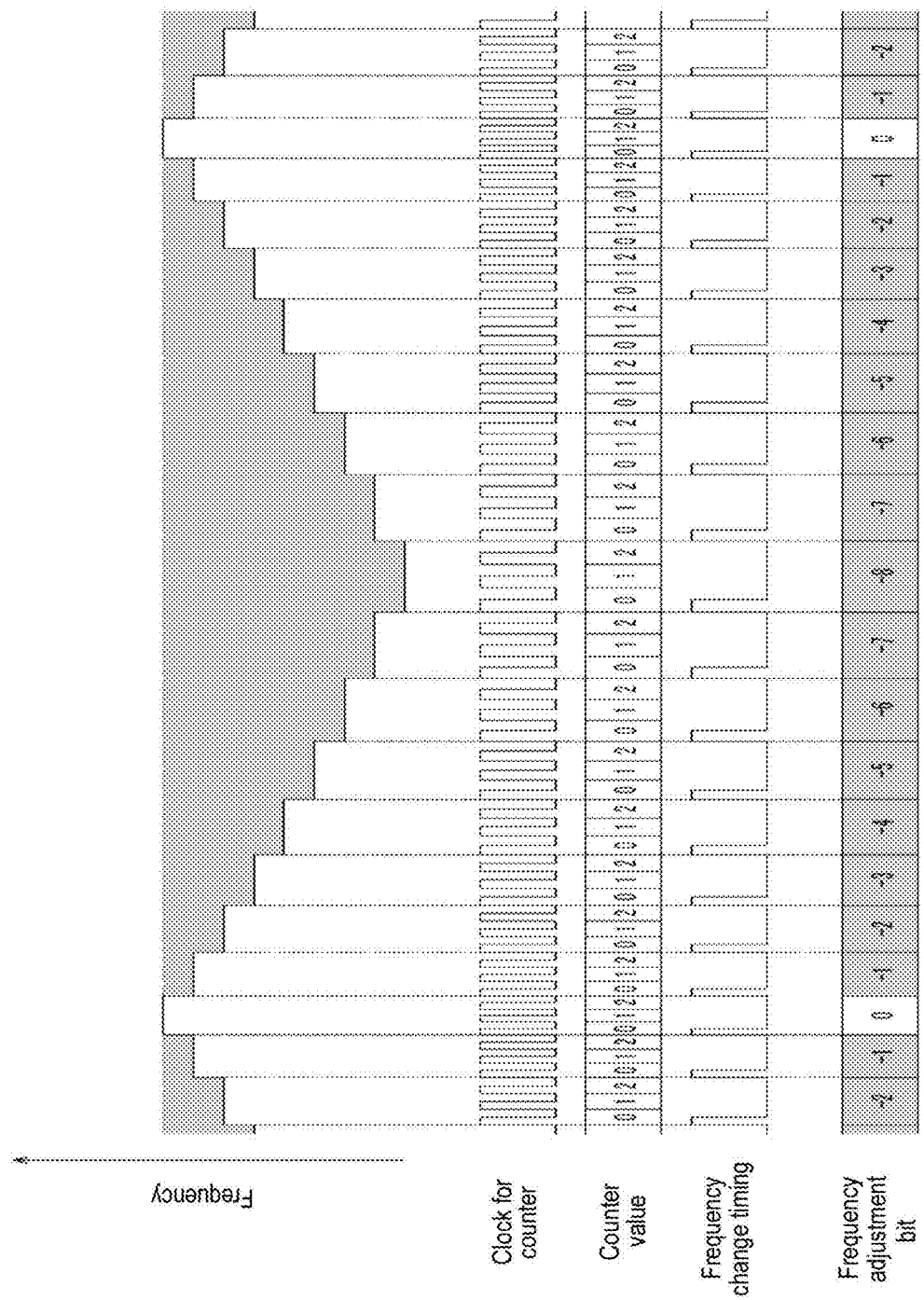
FIG. 10 is a timing chart illustrating results of a down spreading in the first embodiment.

FIG. 10 is a timing chart illustrating results of the down-spreading in the first embodiment, in which the oscillation frequency f1, the clock (=clock signal S13) for counter, the counter value S21, the frequency change timing signal, and the frequency adjustment bit are illustrated sequentially from above.

In the example of FIG. 10, a trigger pulse of the frequency change timing signal is generated whenever a pulse of the clock signal S13 is counted three times, and the frequency adjustment bit is cyclicly switched by one step each time from 0 step to −8 step in synchronization with the trigger pulse. As a result, the oscillation frequency f1 of the clock signal S13 is periodically changed based on the target value as an upper limit value.

Figure 11:
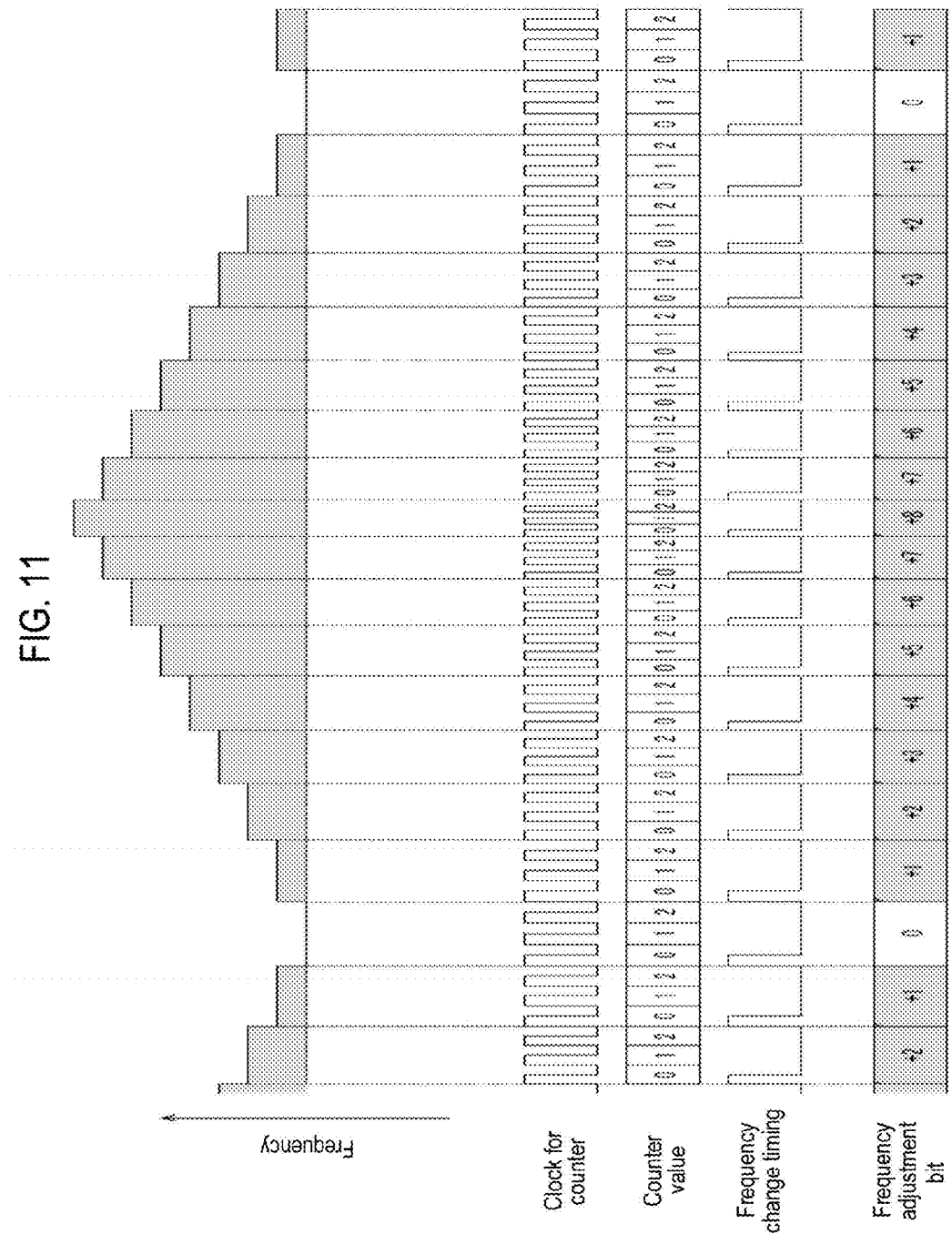
FIG. 11 is a timing chart illustrating results of an up spreading in the first embodiment.

FIG. 11 is a timing chart illustrating results of the up-spreading in the first embodiment, in which the oscillation frequency f1, the clock (=clock signal S13) for counter, the counter value S21, the frequency change timing signal, and the frequency adjustment bit are illustrated sequentially from above.

In the example of FIG. 11, a trigger pulse of the frequency change timing signal is generated whenever a pulse of the clock signal S13 is counted three times, and the frequency adjustment bit is cyclicly switched by one step each time from 0 step to +8 step in synchronization with the trigger pulse. As a result, the oscillation frequency f1 of the clock signal S13 is periodically changed based on the target value as a lower limit value.

In this manner, in the clock signal generating circuit 200 of the first embodiment, a frequency spreading function of the oscillation frequency f1 may be extremely simply implemented by utilizing a trimming function of the oscillation frequency f1. However, in the clock signal generating circuit 200 of the first embodiment, since the frequency change timing is determined depending on the number of pulses of the clock signal S13, the frequency spreading also affects a modulation period of the oscillation frequency f1. In other words, as the oscillation frequency f1 is increased, the modulation period is shortened, and as the oscillation frequency f1 is lowered, the modulation period is lengthened. As a result, a time average value of the oscillation frequency f1 is inclined to a low frequency side.

Second Embodiment

Figure 12:
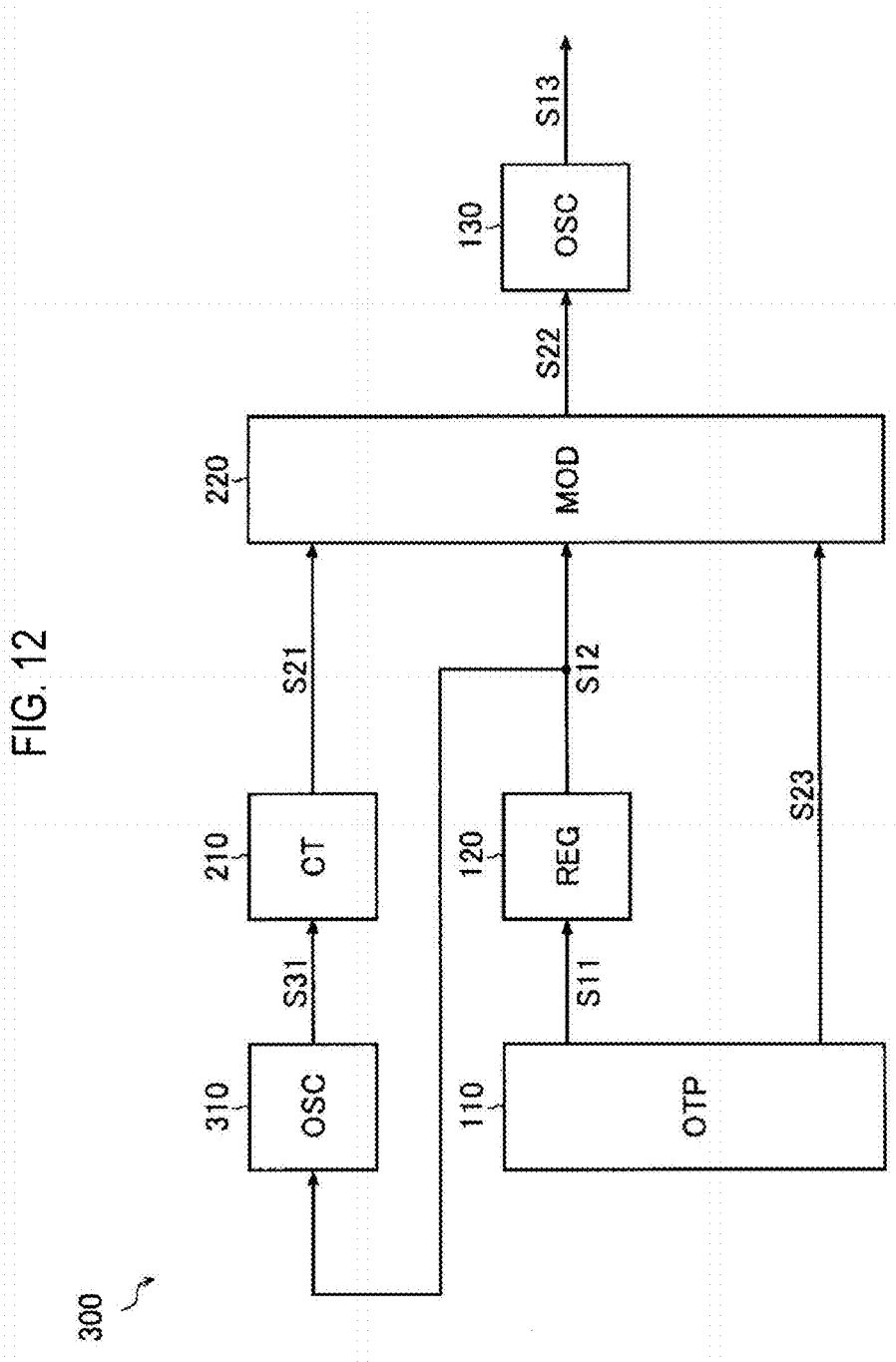
FIG. 12 is a block diagram illustrating a second embodiment of a clock signal generating circuit.

FIG. 12 is a block diagram illustrating a second embodiment of a clock signal generating circuit. A clock signal generating circuit 300 of the second embodiment is based on the foregoing first embodiment (FIG. 6), and additionally includes an oscillator 310 as a circuit block for preventing a variation of the oscillation frequency f1. Thus, the same circuit blocks as those of the foregoing first embodiment will be given the same reference numerals as those of FIG. 6 and a repeated description thereof will be omitted, and a characteristics part of the second embodiment will be largely described hereinafter.

The oscillator 310 outputs a clock signal S31 having a fixed oscillation frequency f2 to the counter 210. Further, the oscillator 310 has a trimming function for arbitrarily adjusting the oscillation frequency f2 of the clock signal S31 generated by the oscillator 310, depending on the reference trimming data S12. As the circuit component of the oscillator 310, the circuit component such as the oscillator 130 (see the foregoing FIG. 2 or FIGS. 5A and 5B) may be employed, and thus, a repeated description thereof will be omitted.

The counter 210 counts the number of pulses of the clock signal S31 having the fixed oscillation frequency f2, rather than the clock signal S13 in which frequency modulation (frequency spreading) is applied to the oscillation frequency f1, to output the counter value 21. The trimming data modulation part 220 switches the data value of the modulation trimming data S22 at a frequency change timing depending on the counter value S21.

As described above, when a variation of the oscillation frequency f1 is not allowed, the oscillator 310 for determining a frequency change timing may be provided in a separate system, in addition to the oscillator 130 for generating the clock signal S13, and frequency modulation (frequency spreading) may be controlled not to affect the clock signal S31 generated by the oscillator 310.

With such a configuration, an increment period of the counter value S21 may be uniform and, in addition, the frequency change timing may be uniform. Thus, since a period in which the oscillation frequency f1 is set as a high frequency and a period in which the oscillation frequency f1 is set as a low frequency are equal, a variation of the oscillation frequency f1 may be resolved.

Further, the oscillator 310 has a very small area, compared with the existing SSCG circuit (see FIG. 20). Thus, even though one oscillator 310 is additionally implemented, the circuit size may be considerably reduced, compared with the case in which the existing SSCG circuit is implemented.

Figure 13:
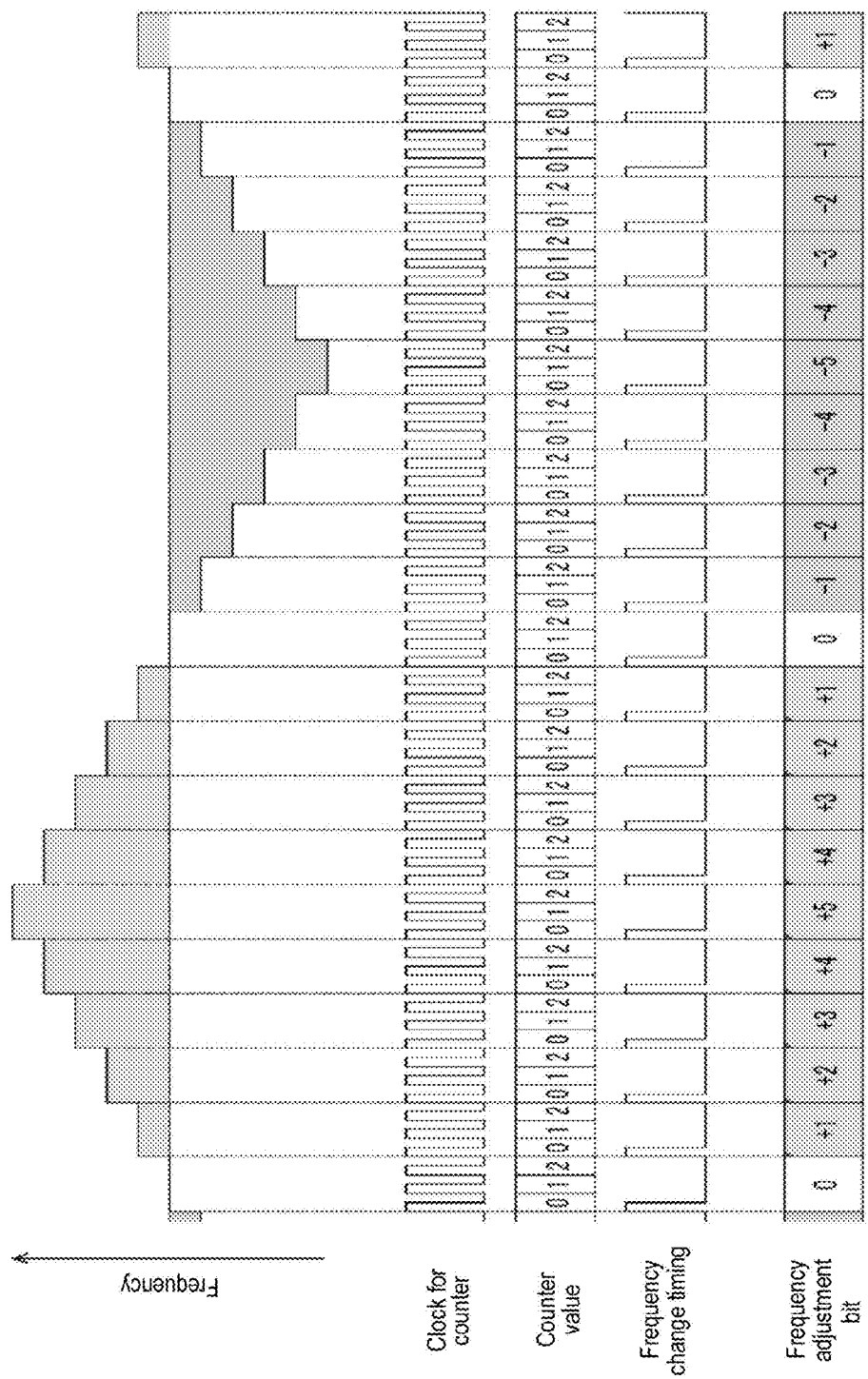
FIG. 13 is a timing chart illustrating results of a center spreading in the second embodiment.
Figure 14:
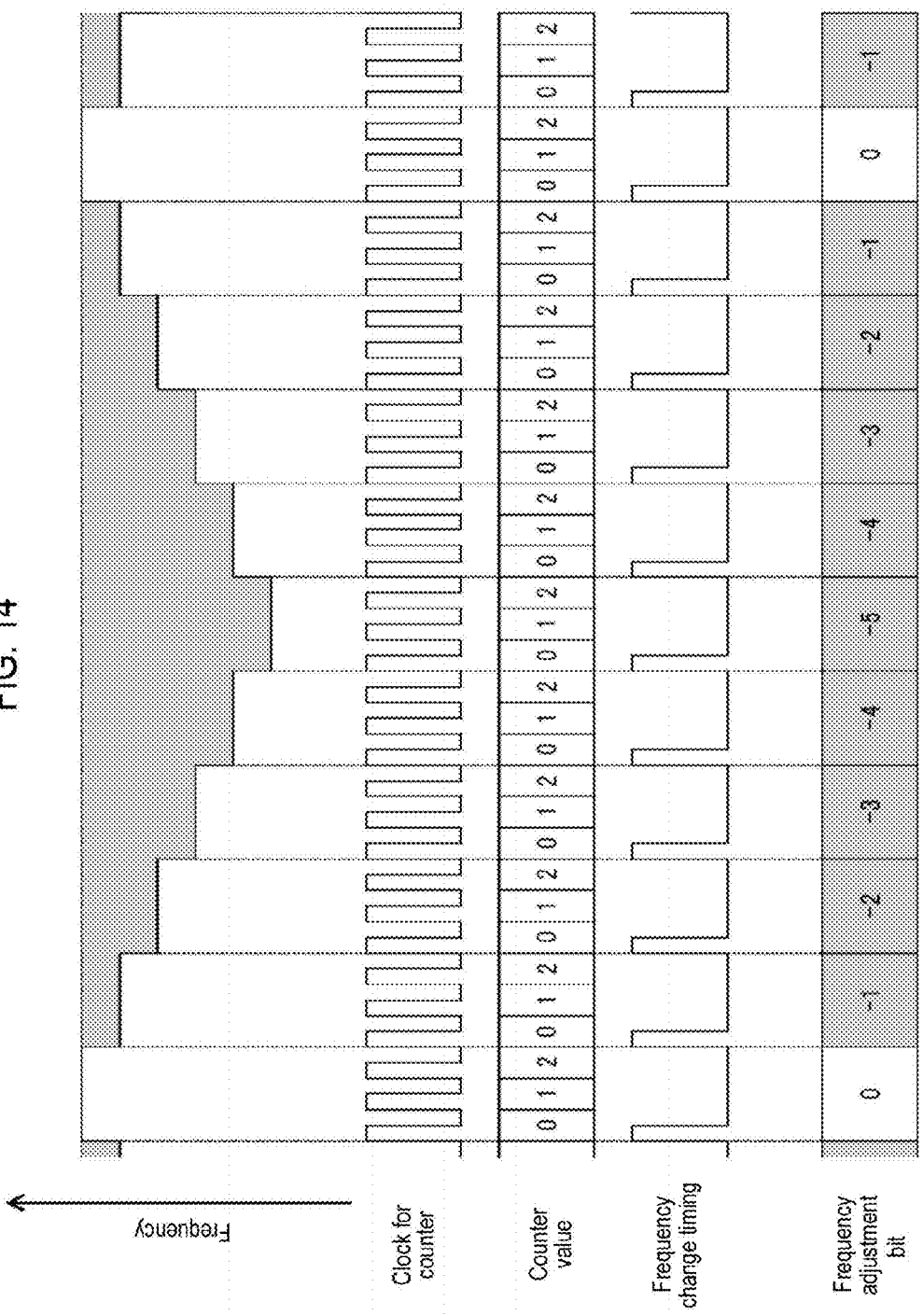
FIG. 14 is a timing chart illustrating results of a down spreading in the second embodiment.
Figure 15:
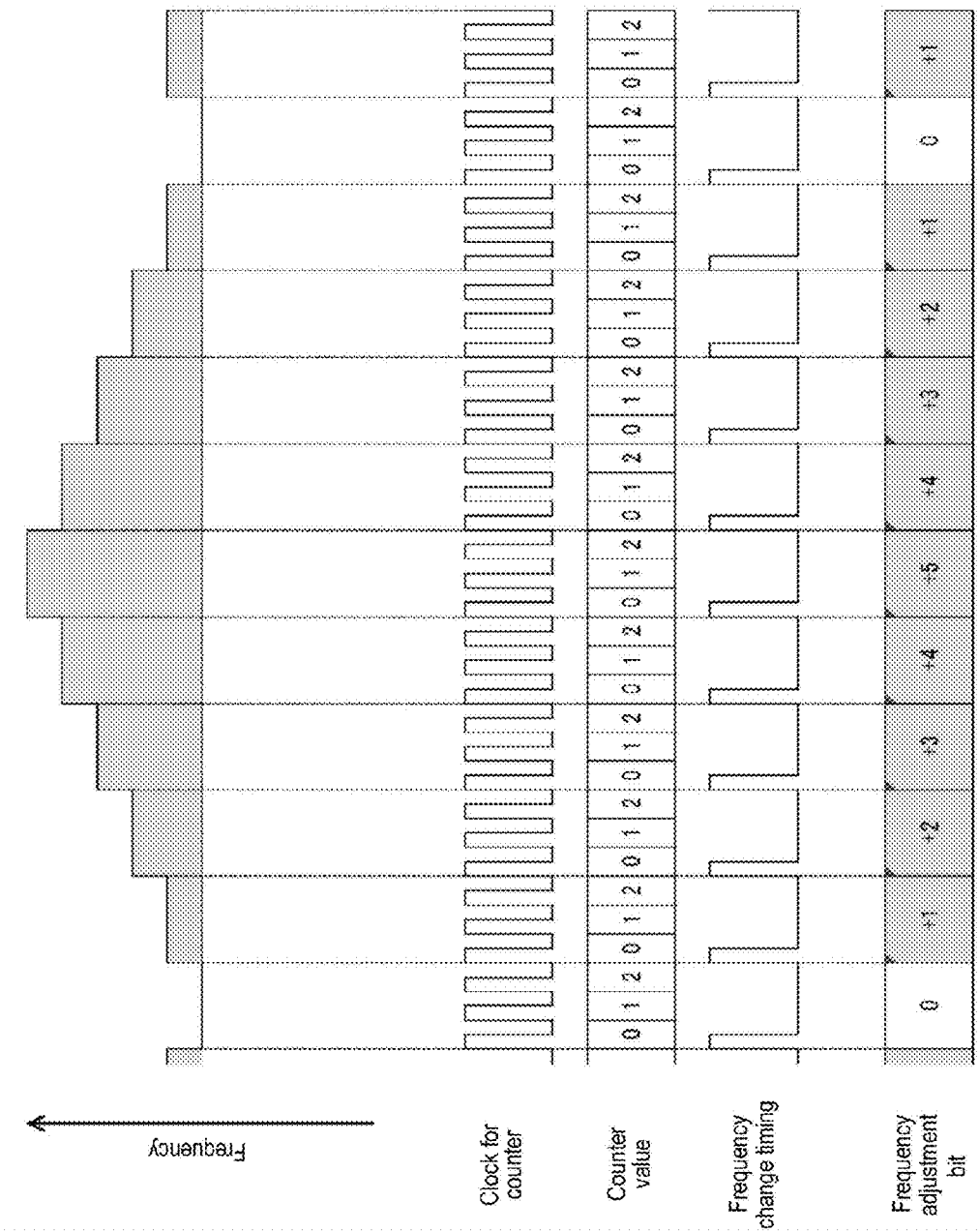
FIG. 15 is a timing chart illustrating results of up spreading in the second embodiment.

FIGS. 13 to 15 are timing charts illustrating results of the center spreading, results of the down-spreading, and results of the up-spreading result in the second embodiment, respectively, in which the oscillation frequency f1, the clock (=clock signal S31) for counter, the counter value S21, the frequency change timing signal, and the frequency adjustment bit are illustrated sequentially from above.

In any drawing, a trigger pulse of the frequency change timing signal is generated whenever the pulse of the clock signal S31 is counted three times, and the frequency adjustment bit is cyclicly switched by one step each time in synchronization with the trigger pulse. Further, since the oscillation frequency f2 of the clock signal S31 is uniform, it can be seen that the period in which the oscillation frequency f1 is set to a high frequency and the period in which the oscillation frequency f1 is set to a low frequency are equal.

Third Embodiment

Figure 16:
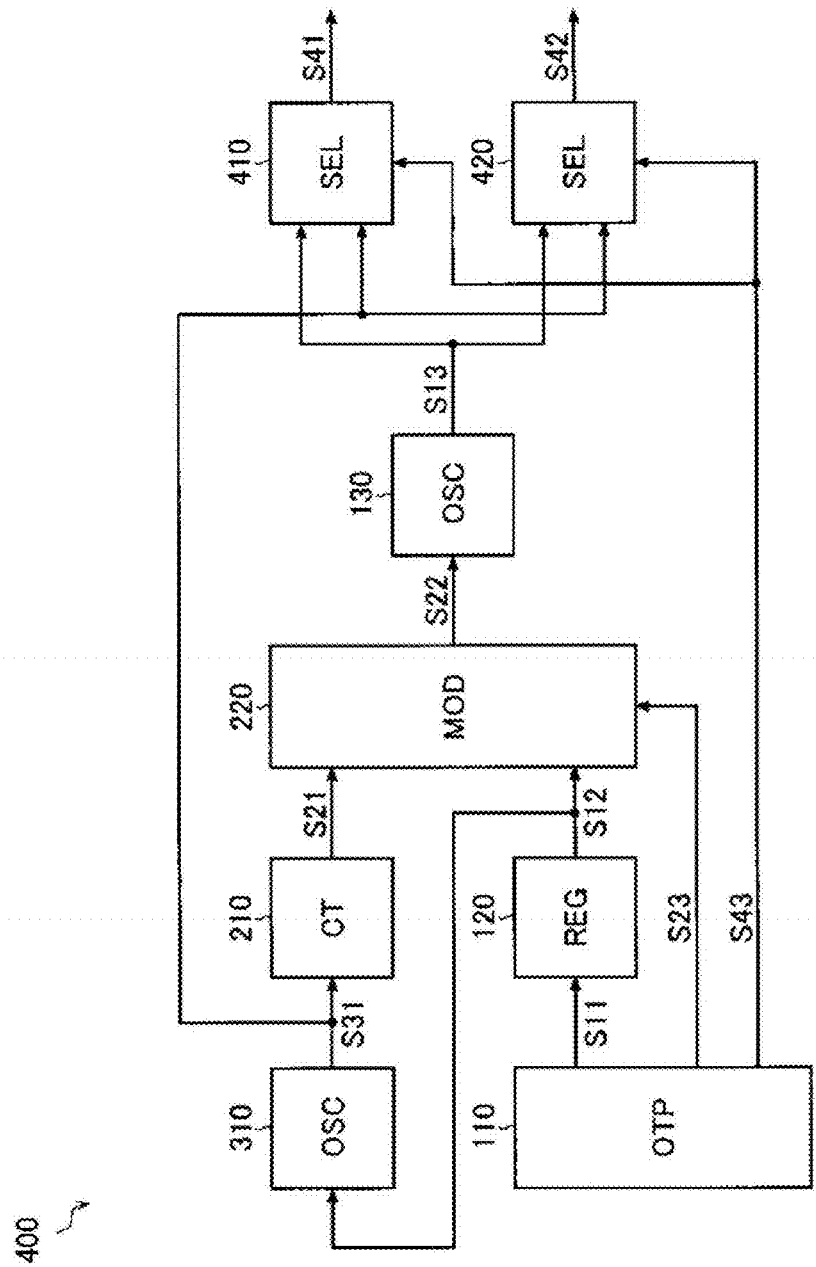
FIG. 16 is a block diagram illustrating a third embodiment of a clock signal generating circuit.

FIG. 16 is a block diagram illustrating a third embodiment of a clock signal generating circuit. The clock signal generating circuit 400 of the third embodiment is based on the foregoing second embodiment (FIG. 12), and further includes selectors 410 and 420 as circuit blocks for more effectively utilizing the clock signal S31. Thus, the same circuit blocks as those of the foregoing second embodiment will be given the same reference numerals as those of FIG. 12 and a repeated description thereof will be omitted, and a characteristics part of the third embodiment will be largely described hereinafter.

The selector 410 selects one of the clock signal S13 and the clock signal S31, as a clock signal S41, depending on a selector control signal S43, and outputs the selected clock signal S41 to a first circuit block (not shown).

The selector 420 selects one of the clock signal S13 and the clock signal S31, as a clock signal S42, depending on the selector control signal S43, and outputs the selected clock signal S42 to a second circuit block (not shown).

The select control signal S43 may be read from the OTPROM or from the register 120, or may be input from the outside of the device.

With this configuration, more appropriate one of the clock signal S13 to which frequency modulation is applied and the clock signal S31 to which frequency modulation is not applied may be arbitrarily selected and output to each of the first circuit block and the second circuit block.

In particular, by providing the plurality of selectors, it is possible to select whether to apply frequency modulation to a clock signal in each of the plurality of circuit blocks. In addition, after checking an effect of reducing EMI by applying frequency modulation to a clock signal, whether to continuously apply the frequency modulation may also be determined.

Application to Electronic Device

Figure 17:
FIG. 17 is a view illustrating an external appearance of a mobile phone (smart phone).
Figure 18:
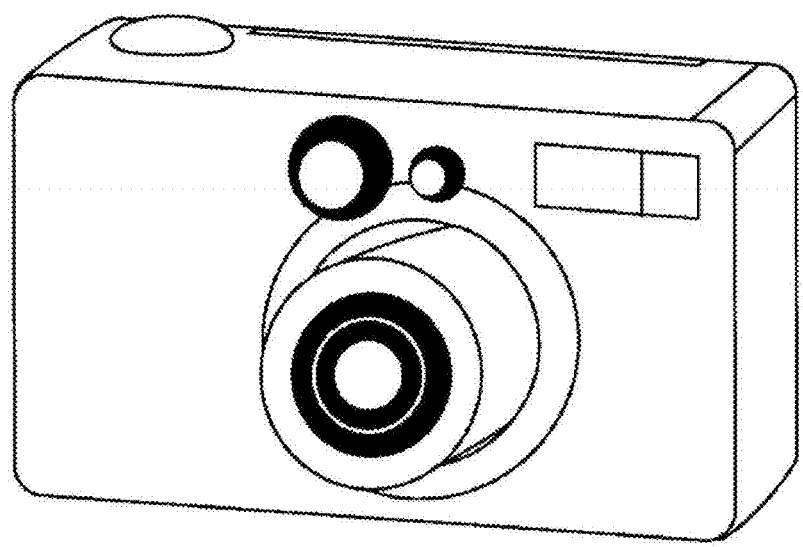
FIG. 18 is a view illustrating an external appearance of a digital still camera.

FIGS. 17 and 18 are views illustrating external appearances of a smart phone X and a digital still camera Y, respectively. For example, when the clock signal generating circuit described above is mounted on a driver LSI for driving a display panel included in each of the electronic devices, measures may be simply taken against EMI without having to implement a large SSCG circuit.

<Application to Vehicle>

Figure 19:
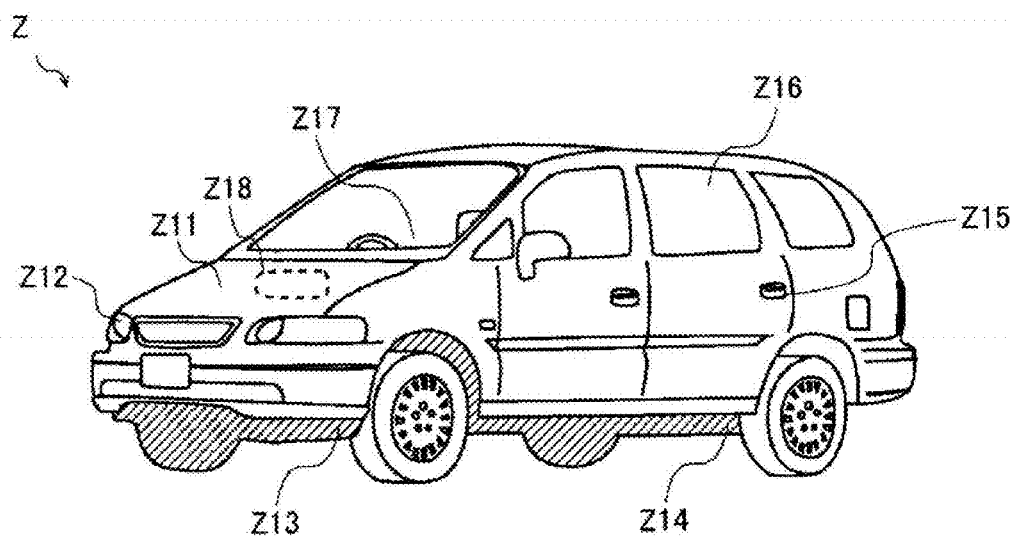
FIG. 19 is a view illustrating an external appearance of a vehicle.

FIG. 19 is an external appearance illustrating a configuration example of a vehicle Z. The vehicle Z of this configuration example is equipped with a battery (not shown) and various electronic devices Z11 to Z18 operated with a source voltage supplied from the battery. Further, in FIG. 19, mounting positions of the electronic devices Z11 to Z18 may be different from real positions for convenience of description.

The electronic device Z11 is an engine control unit for performing controlling (injection control, electronic throttle control, idling control, oxygen sensor heater control, and auto-cruise control, etc.) in relation to an engine.

The electronic device Z12 is a lamp control unit that controls turning on or off a high intensity discharged lamp (HID), a daytime running lamp (DRL), or the like.

The electronic device Z13 is a transmission control unit for performing controlling in relation to a transmission.

The electronic device Z14 is a body control unit for performing controlling (anti-lock brake system (ABS) control, electric power steering (EPS) control, electronic suspension control, etc.) in relation to a movement of the vehicle X.

The electronic device Z15 is a security control unit for performing driving controlling such as a doorlock or security alarm.

The electronic device Z16 is an electronic device installed in the vehicle Z at a stage of releasing from a factory, as standard equipment or a manufacturer optional product, such as a wiper, a electrically-moving door mirror, a power window, a damper (shock absorber), a electrically-moving sun roof, and a electrically-moving seat.

The electronic device Z17 is an electronic device arbitrarily installed in the vehicle Z as a user optional product, such as a vehicle audio/visual (A/V) device, a car navigation system, and an electronic toll collection system (ETC).

The electronic device Z18 is an electronic device including a high-voltage motor, such as a vehicle blower, an oil pump, a water pump, or a battery cooling fan.

Further, the foregoing clock signal generating circuit may be integrated into any one of the electronic devices Z11 to Z18.

<Other Modifications>

Further, various technical features disclosed herein may be variously modified, in addition to the foregoing embodiments, without departing from the spirit of the present disclosure. In other words, the embodiments are merely illustrative and not intended to limit the scope of the present disclosure, in all respects. The technical scope of the present disclosure is presented by claims, rather than the description of the embodiments, and is to be understood to encompass all changes that fall within the meaning and range equivalent to the scope of the claims.

According to the present disclosure in some embodiments, it is possible to provide a clock signal generation circuit capable of easily realizing frequency spreading of a clock signal.

The present disclosure disclosed herein may be generally used in a clock signal generation circuit having a trimming function of an oscillation frequency.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A clock signal generating circuit, comprising:
a first oscillator configured to have a trimming function of arbitrarily adjusting an oscillation frequency of a first clock signal generated by the first oscillator depending on trimming data;
a trimming data modulation part configured to dynamically change a reference trimming data for adjusting the oscillation frequency of the first clock signal to generate modulation trimming data, and output the modulation trimming data, as the trimming data, to the first oscillator,
a second oscillator configured to generate a second clock signal having a fixed oscillation frequency; and
a counter configured to count the number of pulses of the second clock signal to output a counter value,
wherein the trimming data modulation part is further configured to switch a data value of the modulation trimming data at a frequency change timing based on the counter value; and
wherein the second oscillator is further configured to have a trimming function for arbitrarily adjusting an oscillation frequency of the second clock signal generated by the second oscillator itself, depending on the reference trimming data.

2. The circuit of claim 1 further comprising a trimming data holding part configured to hold the reference trimming data by using a non-volatile memory, a Zener zap method, a polysilicon fuse method, or a laser cutting method.

3. The circuit of claim 1, wherein the trimming data modulation part is further configured to perform a center spreading for changing the modulation trimming data based on the reference trimming data as a central value, a down-spreading for changing the modulation trimming data based on the reference trimming data as an upper limit value, or an up-spreading for changing the modulation trimming data based on the reference trimming data as a lower limit value.

4. The circuit of claim 1, wherein the trimming data modulation part is further configured to have a function of setting ON/OFF of frequency spreading with respect to the oscillation frequency of the first clock signal, a function of setting a modulation period of the oscillation frequency in the frequency spreading, and a function of setting a modulation width of the oscillation frequency in the frequency spreading.

5. An electronic device comprising the clock signal generating circuit of claim 1.

6. A clock signal generating circuit, comprising:
a first oscillator configured to have a trimming function of arbitrarily adjusting an oscillation frequency of a first clock signal generated by the first oscillator depending on trimming data;
a trimming data modulation part configured to dynamically change a reference trimming data for adjusting the oscillation frequency of the first clock signal to generate modulation trimming data, and output the modulation trimming data, as the trimming data, to the first oscillator,
a second oscillator configured to generate a second clock signal having a fixed oscillation frequency;
a counter configured to count the number of pulses of the second clock signal to output a counter value; and
one or more selectors configured to select and output one of the first clock signal and the second clock signal,
wherein the trimming data modulation part is further configured to switch a data value of the modulation trimming data at a frequency change timing based on the counter value.

7. The circuit of claim 6, further comprising a trimming data holding part configured to hold the reference trimming data by using a non-volatile memory, a Zener zap method, a polysilicon fuse method, or a laser cutting method.

8. The circuit of claim 6, wherein the trimming data modulation part is further configured to perform a center spreading for changing the modulation trimming data based on the reference trimming data as a central value, a down-spreading for changing the modulation trimming data based on the reference trimming data as an upper limit value, or an up-spreading for changing the modulation trimming data based on the reference trimming data as a lower limit value.

9. The circuit of claim 6, wherein the trimming data modulation part is further configured to have a function of setting ON/OFF of frequency spreading with respect to the oscillation frequency of the first clock signal, a function of setting a modulation period of the oscillation frequency in the frequency spreading, and a function of setting a modulation width of the oscillation frequency in the frequency spreading.

10. An electronic device comprising the clock signal generating circuit of claim 6.

* * * * *